United States Patent
Asako et al.

(10) Patent No.: US 10,903,085 B2
(45) Date of Patent: *Jan. 26, 2021

(54) METHOD FOR ETCHING ORGANIC REGION

(71) Applicant: TOKYO ELECTRON LIMITED, Tokyo (JP)

(72) Inventors: Ryuichi Asako, Miyagi (JP); Masahiro Tabata, Miyagi (JP); Takao Funakubo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/390,326

(22) Filed: Apr. 22, 2019

(65) Prior Publication Data

US 2019/0326106 A1    Oct. 24, 2019

(30) Foreign Application Priority Data

Apr. 23, 2018 (JP) .................................. 2018-082127

(51) Int. Cl.
| | | |
|---|---|---|
| *H01L 21/311* | (2006.01) | |
| *H01J 37/32* | (2006.01) | |
| *H01L 51/00* | (2006.01) | |
| *H01L 21/67* | (2006.01) | |
| *C23C 16/00* | (2006.01) | |
| *H01L 21/683* | (2006.01) | |
| *H01L 21/02* | (2006.01) | |
| *H01L 21/3065* | (2006.01) | |

(52) U.S. Cl.
CPC ........ *H01L 21/31138* (2013.01); *C23C 16/00* (2013.01); *H01J 37/32449* (2013.01); *H01J 37/32853* (2013.01); *H01J 37/32862* (2013.01); *H01J 37/32981* (2013.01); *H01L 21/02118* (2013.01); *H01L 21/3065* (2013.01); *H01L 21/6719* (2013.01); *H01L 21/67103* (2013.01); *H01L 21/67109* (2013.01); *H01L 21/6831* (2013.01); *H01L 51/0017* (2013.01)

(58) Field of Classification Search
None
See application file for complete search history.

(56) References Cited

U.S. PATENT DOCUMENTS

2006/0213864 A1    9/2006 Tahara et al.
2007/0204797 A1*  9/2007 Fischer ............ H01J 37/32642
                                                118/723 R

FOREIGN PATENT DOCUMENTS

JP       2006-269879 A    10/2006

\* cited by examiner

*Primary Examiner* — Jiong-Ping Lu
(74) *Attorney, Agent, or Firm* — Rothwell, Figg, Ernst & Manbeck, P.C.

(57) ABSTRACT

There is provided a method for etching an organic region of a substrate. In the method, an organic film is formed on a surface in a chamber of a plasma processing apparatus. The surface extends out around a region where the substrate is to be disposed in the chamber of the plasma processing apparatus, and the organic region is etched by chemical species from plasma in the chamber.

19 Claims, 8 Drawing Sheets

METHOD FOR ETCHING ORGANIC REGION

CROSS-REFERENCE TO RELATED APPLICATIONS

This application claims priority to Japanese Patent Application No. 2018-082127, filed on Apr. 23, 2018, the entire contents of which are incorporated herein by reference.

TECHNICAL FIELD

The present disclosure relates to a method for etching an organic region.

BACKGROUND

In manufacturing electronic devices, plasma etching is performed on a substrate. The plasma etching is performed in a state where the substrate is provided in a chamber of a plasma processing apparatus. Plasma of a processing gas is generated in the chamber. The substrate is etched with chemical species supplied from the plasma.

In plasma etching, it is required to etch the substrate while ensuring in-plane uniformity. In other words, high in-plane uniformity is required in plasma etching. Japanese Patent Application Publication No. 2006-269879 discloses a technique for controlling an amount of gas supplied to a central region of a substrate and an amount of gas supplied to a peripheral region of the substrate to thereby obtain high in-plane uniformity in plasma etching.

Plasma etching may be performed to etch an organic region of the substrate. The high in-plane uniformity is also required in the plasma etching of the organic region.

SUMMARY

In accordance with an aspect, there is provided a method for etching an organic region of a substrate, including: forming an organic film on a surface in a chamber of a plasma processing apparatus, the surface extending out around a region where the substrate is to be disposed in the chamber of the plasma processing apparatus; and etching the organic region with chemical species from plasma in the chamber.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
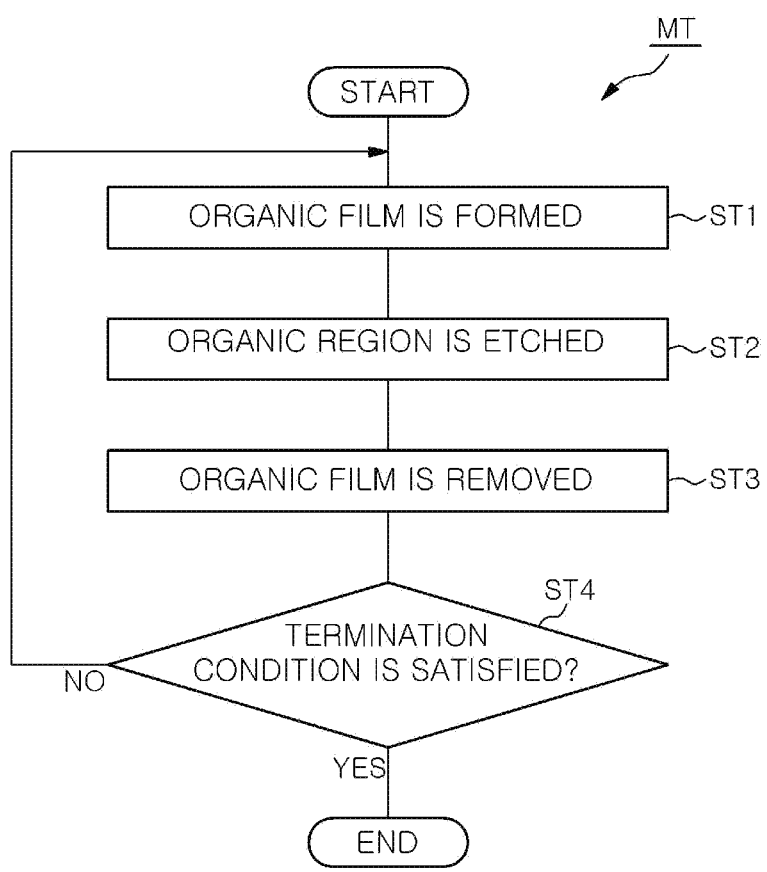
FIG. 1 is a flowchart of a method for etching an organic region of a substrate according to an embodiment.

Hereinafter, embodiments will be described in detail with reference to the accompanying drawings. Like reference numerals will be given to like or corresponding parts throughout the drawings.

Figure 2:
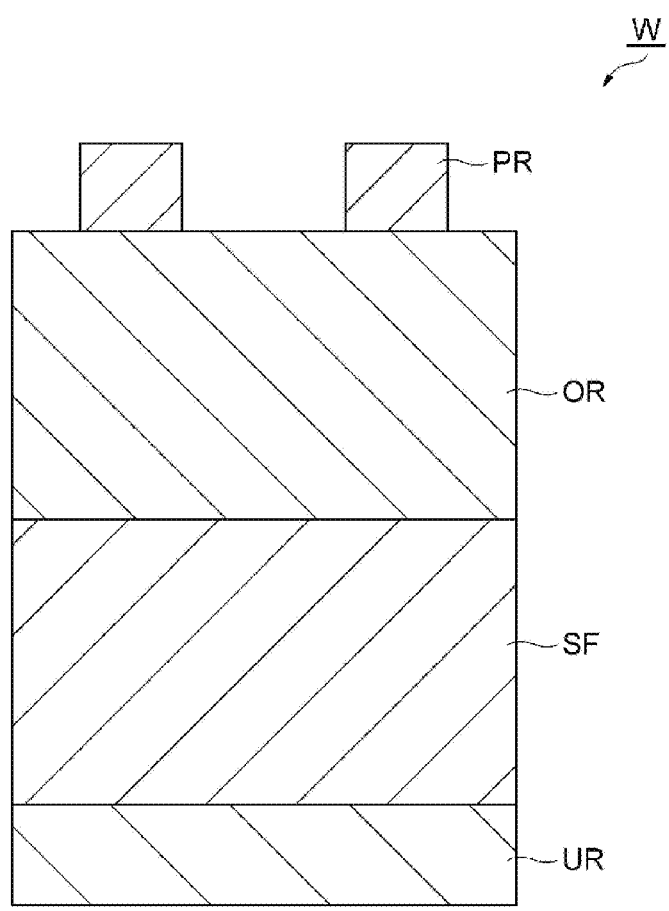
FIG. 2 is a partially enlarged cross-sectional view of an exemplary substrate to which the method shown in FIG. 1 can be applied.

FIG. 1 is a flowchart of a method for etching an organic region of a substrate according to an embodiment. A method MT shown in FIG. 1 is performed to etch the organic region of the substrate. FIG. 2 is a partially enlarged cross-sectional view of an exemplary substrate to which the method shown in FIG. 1 can be applied. The substrate W shown in FIG. 2 may have a substantially disc shape. The substrate W has an organic region OR and a patterned region PR.

The organic region OR is made of an organic material. The patterned region PR is provided on the organic region OR. The patterned region PR is used as a mask for plasma etching of the organic region OR. The patterned region PR is provided with one or more openings through which the organic region OR is partially exposed. The patterned region PR is, e.g., an anti-reflection film containing silicon. The patterned region PR is formed by performing plasma etching on the anti-reflection film having a resist mask formed thereon.

The substrate W may further have an underlying region UR. The organic region OR is provided on the underlying region UR. The substrate W may further have a film SF. The film SF is provided between the organic region OR and the underlying region UR. The film SF may be a multilayer film or a monolayer film containing silicon. The film SF is, e.g., a laminated film including a silicon oxide film and a silicon film. The film SF may be etched by plasma etching through a mask formed from the organic region OR by executing step ST2 to be described later.

Figure 3:
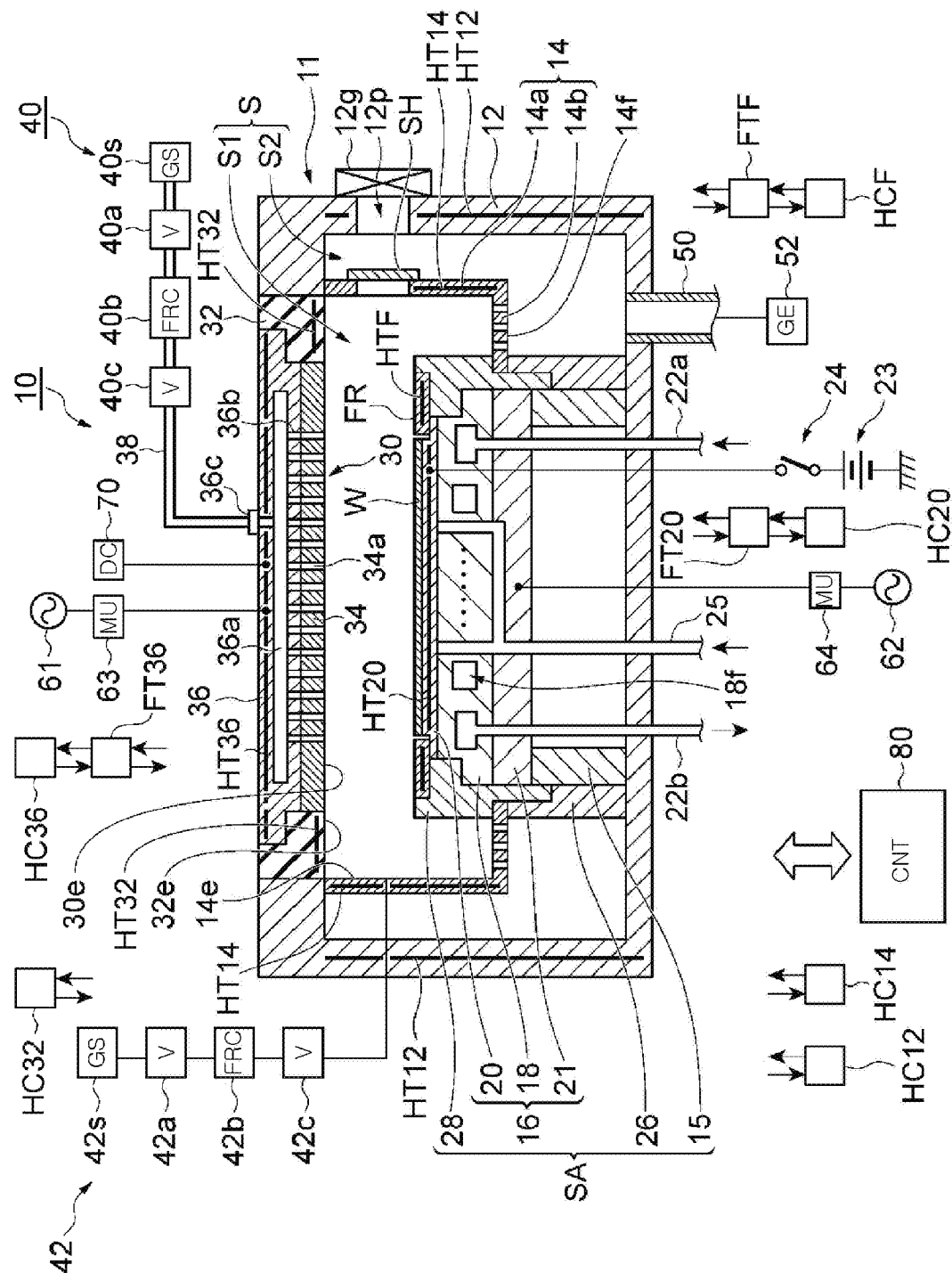
FIG. 3 shows an exemplary plasma processing apparatus that can perform the method shown in FIG. 1.

Hereinafter, the case in which the method MT is used for etching the organic region OR of the substrate W shown in FIG. 2 will be described as an example. The method MT can be applied to any substrate having an organic region. The method MT is performed by using a plasma processing apparatus. FIG. 3 shows an exemplary plasma processing apparatus that can be used to perform the method shown in FIG. 1. The plasma processing apparatus 10 shown in FIG. 3 is a capacitively coupled plasma processing apparatus.

The plasma processing apparatus 10 includes a chamber 11. The chamber 11 has an inner space S therein. The inner space S includes a first space S1 and a second space S2. The chamber 11 includes a chamber body 12. The chamber body 12 has a substantially cylindrical shape. The chamber body 12 has the inner space S therein. The chamber body 12 is made of, e.g., aluminum. The chamber body 12 is frame grounded. A corrosion resistant film is formed on an inner wall surface of the chamber body 12, i.e., on a surface of the chamber body 12 that defines the inner space S. The corrosion resistant film may be a film formed by anodic oxidation treatment, or a ceramic film made of yttrium oxide.

A heater HT2 (e.g., resistance heating element) is provided in the chamber body 12, e.g., in a sidewall of the chamber body 12. The heater HT12 generates heat by power supplied from a heater controller HC12.

A passage 12p is formed in the sidewall of the chamber body 12. The substrate W is transferred between the inner space S and the outside of the chamber 11 through the passage 12p. The passage 12p can be opened and closed by a gate valve 12g. The gate valve 12g is provided along the sidewall of the chamber body 12.

A partition wall 14 is provided in the inner space S. The partition wall 14 extends on the boundary between the first space S1 and the second space S2. A plurality of through-holes is formed in the partition wall 14 so that the first space S1 and the second space S2 communicate with each other therethrough. The partition wall 14 may be formed by forming a corrosion resistant film on a surface of a base. The corrosion resistant film may be a film formed by anodic oxidation treatment, or a ceramic film made of yttrium oxide. The base is made of, e.g., aluminum. An opening is formed in the partition wall 14 to face the passage 12p. The substrate W is transferred between the first space S1 and the outside of the chamber 11 through the passage 12p and the opening of the partition wall 14. The opening of the partition wall 14 can be opened and closed by a shutter SH. A heater HT14 (e.g., resistance heating element) is provided in the partition wall 14. The heater HT14 generates heat by power supplied from a heater controller HC14.

The partition wall 14 may include a shield portion 14a and a baffle plate 14b. The shield portion 14a has a substantially cylindrical shape. The shield portion 14a extends in a vertical direction along the sidewall of the chamber body 12 in the inner space S. The shield portion 14a is separated from the sidewall of the chamber body 12. An upper end of the shield portion 14a extends to an upper portion of the chamber 11 and is fixed to the upper portion of the chamber 11. In the plasma processing apparatus 10, substrate treatment such as plasma etching is performed in the first space S1. During the substrate treatment, by-products such as reaction products and the like are generated. The amount of the by-products adhered to the surface of the chamber body 12 is reduced by the shield portion 14a.

The baffle plate 14b extends in a direction orthogonal to the shield portion 14a. The baffle plate 14b extends between the shield portion 14a and a supporting table to be described later. The above-described through-holes of the partition wall 14 are formed in the baffle plate 14b. The shield portion 14a and the baffle plate 14b may be formed as one unit or may be separable from each other.

In the inner space S, a supporting part 15 extends upward from a bottom portion of the chamber body 12. The supporting part 15 has a substantially cylindrical shape and is made of an insulating material such as quartz. A supporting table 16 is mounted on the supporting part 15. The supporting table 16 is supported by the supporting part 15. The supporting table 16 is configured to support the substrate W in the first space S1. The supporting table 16 includes a lower electrode 18 and an electrostatic chuck 20. The supporting table 16 may further include an electrode plate 21. The electrode plate 21 is made of a conductive material such as aluminum or the like and has a substantially disc shape. The lower electrode 18 is provided on the electrode plate 21. The lower electrode 18 is made of a conductive material such as aluminum or the like and has a substantially disc shape. The lower electrode 18 is electrically connected to the electrode plate 21.

A flow path 18f is provided in the lower electrode 18. The flow path 18f is a channel for a heat exchange medium. As for the heat exchange medium, a liquid coolant or a coolant (e.g., Freon) for cooling the lower electrode 18 by vaporization thereof is used. The heat exchange medium is supplied to the flow path 18f from a chiller unit through a line 22a. The chiller unit is provided outside the chamber body 12. The heat exchange medium supplied to the flow path 18f is returned to the chiller unit through a line 22b. In this manner, the heat exchange medium is supplied to the flow path 18f and circulates between the flow path 18f and the chiller unit.

The electrostatic chuck 20 is provided on the lower electrode 18. The electrostatic chuck 20 includes a main body and an electrode. The main body of the electrostatic chuck 20 is made of a dielectric material and has a substantially disc shape. The electrode of the electrostatic chuck 20 is a film-shaped electrode and is provided in the main body of the electrostatic chuck 20. A DC power supply 23 is electrically connected to the electrodes of the electrostatic chuck 20 through a switch 24. When a voltage is applied from the DC power supply 23 to the electrode of the electrostatic chuck 20, an electrostatic attractive force is generated between the substrate W mounted on the electrostatic chuck 20 and the electrostatic chuck 20. By generating the electrostatic attractive force thus generated, the substrate W is attracted to and held on the electrostatic chuck 20.

The plasma processing apparatus 10 further includes a gas supply line 25. A heat transfer gas, e.g., He gas, is supplied through the gas supply line 25 from a gas supply unit to a gap between an upper surface of the electrostatic chuck 20 and a backside (bottom surface) of the substrate W.

One or more heaters HT20 (e.g., resistance heating elements) may be provided in the electrostatic chuck 20. Power is supplied from a heater controller HC20 to the heaters HT20. A high frequency filter FT20 may be provided between the heaters HT20 and the heater controller HC20 to prevent high frequency power from flowing into the heater controller HC20. When the heaters HT20 are provided in the electrostatic chuck 20, temperatures of a plurality of regions of the electrostatic chuck 20 can be individually controlled by controlling the power supplied from the heater controller HC20 to the heaters HT20 individually. Accordingly, it is possible to control in-plane temperature distribution of the electrostatic chuck 20 (i.e., in-plane temperature distribution of the substrate W).

A focus ring FR is disposed on an outer peripheral region of the electrostatic chuck 20. The focus ring FR has a substantially annular plate shape. The focus ring FR is made of a silicon-containing material such as silicon, quartz, or silicon carbide. The focus ring FR is disposed to surround a peripheral edge of the substrate W. A heater HTF (e.g., resistance heating element) is provided in the focus ring FR. The heater HTF generates heat by power supplied from a heater controller HCF. A high frequency filter FTF may be provided between the heater HTF and the heater controller HCF to prevent high frequency power from flowing into the heater controller HCF.

A tubular member 26 extends upward from the bottom portion of the chamber body 12. The tubular member 26 extends along an outer periphery of the supporting part 15. The tubular member 26 is made of a conductor and has a substantially cylindrical shape. The tubular member 26 is connected to the ground potential. A corrosion resistant film may be formed on a surface of the tubular member 26. The corrosion resistant film may be a film formed by anodic oxidation treatment, or a ceramic film made of yttrium oxide.

An insulating member 28 is provided on the tubular member 26. The insulating member 28 has an insulating property and is made of ceramic such as quartz. The insulating member 28 has a substantially cylindrical shape and extends along the outer peripheries of the electrode plate 21, the lower electrode 18, and the electrostatic chuck 20. The edge portion of the baffle plate 14b may be provided between the tubular member 26 and the insulating member 28 and may be clamped by the tubular member 26 and the insulating member 28.

The supporting part 15, the supporting table 16, the tubular member 26, and the insulating member 28 constitute a support assembly SA. The support assembly SA extends from the first space S1 into the second space S2.

The plasma processing apparatus 10 further includes an upper electrode 30. The upper electrode 30 is provided above the supporting table 16. The upper electrode 30 blocks an upper opening of the chamber body 12 in cooperation with a member 32. The member 32 has an insulating property. A heater HT32 (e.g., resistance heating element) may be provided in the member 32. The heater HT32 generates heat by power supplied from a heater controller HC32. The upper electrode 30 is held on an upper portion of the chamber body 12 by the member 32.

The upper electrode 30 includes a ceiling plate 34 and a holder 36. A bottom surface of the ceiling plate 34 defines the inner space S (or the first space S1). The ceiling plate 34 is provided with a plurality of gas injection holes 34a. The gas injection holes 34a penetrate through the ceiling plate 34 in a plate thickness direction (vertical direction). The ceiling plate 34 is made of, e.g., silicon, but is not limited thereto. Alternatively, the ceiling plate 34 may have a structure in which a corrosion resistant film is formed on a surface of a base. The corrosion resistant film may be a film formed by anodic oxidation treatment or a ceramic film made of yttrium oxide. The base is made of a conductive material, e.g., aluminum.

The holder 36 detachably holds the ceiling plate 34. The holder 36 may be made of a conductive material, e.g., aluminum. A heater HT36 (e.g., resistance heating element) is provided in, e.g., the holder 36 of the upper electrode 30. The heater HT36 generates heat by power supplied from a heater controller HC36. A high frequency filter FT36 may be provided between the heater HT36 and the heater controller HC36 to prevent high frequency power from flowing into the heater controller HC36.

A gas diffusion space 36a is formed inside the holder 36. A plurality of gas holes 36b extends downward from the gas diffusion space 36a. The gas holes 36b communicate with the respective gas injection holes 34a. A gas inlet port 36c is formed at the holder 36. The gas inlet port 36c is connected to the gas diffusion space 36a. A gas supply line 38 is connected to the gas inlet port 36c.

A gas supply unit 40 is connected to the gas supply line 38. The gas supply unit 40 and a gas supply unit 42 to be described later constitute a gas supply system. The gas supply system is connected to the first space S1. The gas supply unit 40 includes a gas source (GS) group 40s, a valve (V) group 40a, a flow rate controller (FRC) group 40b, and a valve (V) group 40c.

The gas source group 40s includes a plurality of gas sources. The gas sources include a plurality of gas sources used in the method MT. The gas sources include a gas source of one of a first gas and a second gas for forming an organic film to be described later. Further, the gas sources include one or more gas sources used for etching the organic region OR of the substrate W. The gas sources may include an inert gas source used for a purge process to be described later.

Each of the valve group 40a and the valve group 40c includes a plurality of valves. The flow rate controller group 40b includes a plurality of flow rate controllers. Each of the flow rate controllers of the flow rate controller group 40b is a mass flow controller or a pressure control type flow controller. The gas sources of the gas source group 40s are respectively connected to the gas supply line 38 through corresponding valves of the valve group 40a, corresponding flow controllers of the flow rate control group 40b, and corresponding valves of the valve group 40c. The gas from the gas supply unit 40 is supplied into the first space S1 through the gas supply line 38, the gas diffusion space 36a, the gas holes 36b, and the gas injection holes 34a.

The plasma processing apparatus 10 further includes a gas supply unit 42. The gas supply unit 42 includes a gas source (GS) 42s, a valve (V) 42a, a flow rate controller (FRC) 42b, and a valve (V) 42c. The gas source 42s is the gas source of the other one of the first gas and the second gas. The flow rate controller 42b is a mass flow controller or a pressure control type flow controller. The gas source 42s is connected to the first space S1 through the valve 42a, the flow rate controller 42b, and the valve 42c. The gas from the gas supply unit 42 is supplied into the first space S1.

A gas exhaust line 50 is connected to the bottom portion of the chamber body 12 of the plasma processing apparatus 10. A gas exhaust (GE) unit 52 is connected to the gas exhaust line 50. The gas exhaust unit 52 is connected to the second space S2 through the gas exhaust line 50. The gas exhaust unit 52 is also connected to the first space S1 through the second space S2 and the through-holes of the partition wall 14. The gas exhaust unit 52 includes a pressure control valve and a depressurization pump. The depressurization pump is connected to the second space S2 through a pressure control valve. The depressurization pump may be a turbo molecular pump and/or a dry pump.

In the first space S1, the plasma processing apparatus 10 can generate plasma of the gas supplied into the first space S1. The plasma processing apparatus 10 further includes a first high frequency power supply 61. The first high frequency power supply 61 generates a first high frequency power for plasma generation. The first high frequency power has a frequency in a range from 27 MHz to 100 MHz, for example. The first high frequency power supply 61 is connected to the upper electrode 30 through a matching unit (MU) 63. The matching unit 63 has a matching circuit for matching an output impedance of the first high frequency power supply 61 and an impedance of a load side (the upper electrode 30 side). Further, the first high frequency power supply 61 may be connected to the lower electrode 18 via the matching unit 63. In that case, the upper electrode 30 is electrically grounded.

The plasma processing apparatus 10 may further include a second high frequency power supply 62. The second high frequency power supply 62 generates a second high frequency power for bias for attracting ions to the substrate W. A frequency of the second high frequency is lower than the frequency of the first high frequency. The frequency of the second high frequency is in a range from 400 kHz to 13.56 MHz, for example. The second high frequency power supply 62 is connected to the lower electrode 18 through a matching unit (MU) 64. The matching unit 64 has a matching circuit for matching an output impedance of the second high frequency power supply 62 and an impedance of a load side (the lower electrode 18 side).

In the plasma processing apparatus 10, when the first high frequency power is supplied in a state in which a gas is supplied into the first space S1, the gas is excited. As a result, plasma is generated in the first space S1. When the second high frequency power is supplied to the lower electrode 18, ions in the plasma are accelerated toward the substrate W.

The plasma processing apparatus 10 further includes a DC power supply (DC) 70. The DC power supply 70 is connected to the upper electrode 30. The DC power supply 70 is configured to apply a negative DC voltage to the upper electrode 30. When the negative DC voltage is applied to the upper electrode 30, positive ions in the plasma generated in the first space S1 collide with the ceiling plate 34 of the upper electrode 30. When the positive ions collide with the ceiling plate 34, secondary electrons are released from the ceiling plate 34. In the case where the ceiling plate 34 is made of silicon, silicon can be released from the ceiling plate 34 when the positive ions collide with the ceiling plate 34.

In one embodiment, the plasma processing apparatus 10 may further include a controller 80. The controller 80 is configured to control the respective components of the plasma processing apparatus 10. The controller 80 may be a computer including a processor, a storage device such as and a memory, an input device, a display device, and the like. The controller 80 executes a control program stored in the storage device and controls the respective components of the plasma processing apparatus 10 based on a recipe data stored in the storage device. Accordingly, the plasma processing apparatus 10 executes a process specified by the recipe data. For example, the controller 80 controls the respective components of the plasma processing apparatus 10 in executing the method MT.

Figure 4:
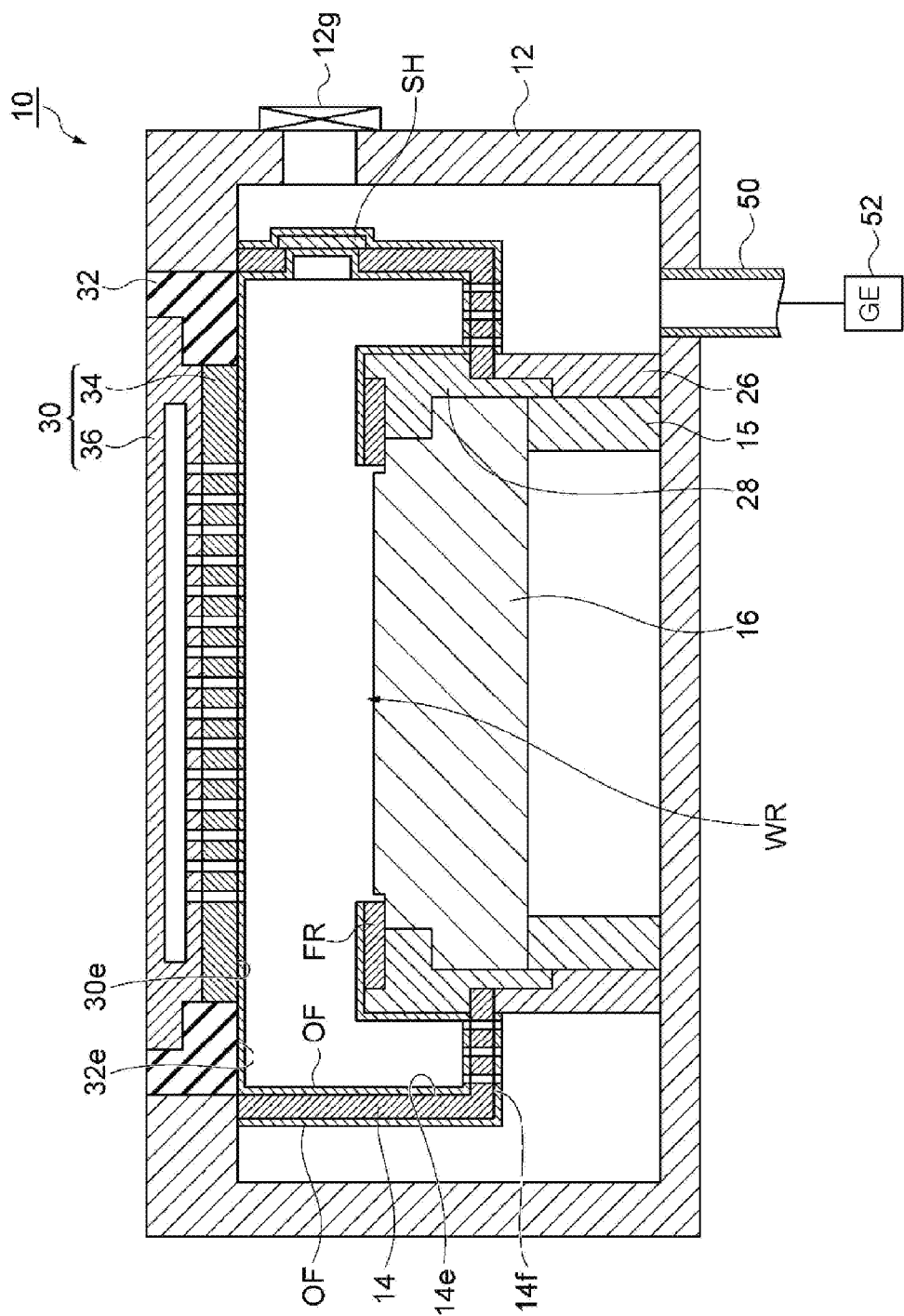
FIG. 4 schematically shows an inner state of a chamber of the exemplary plasma processing apparatus during execution of the method shown in FIG. 1.
Figure 5:
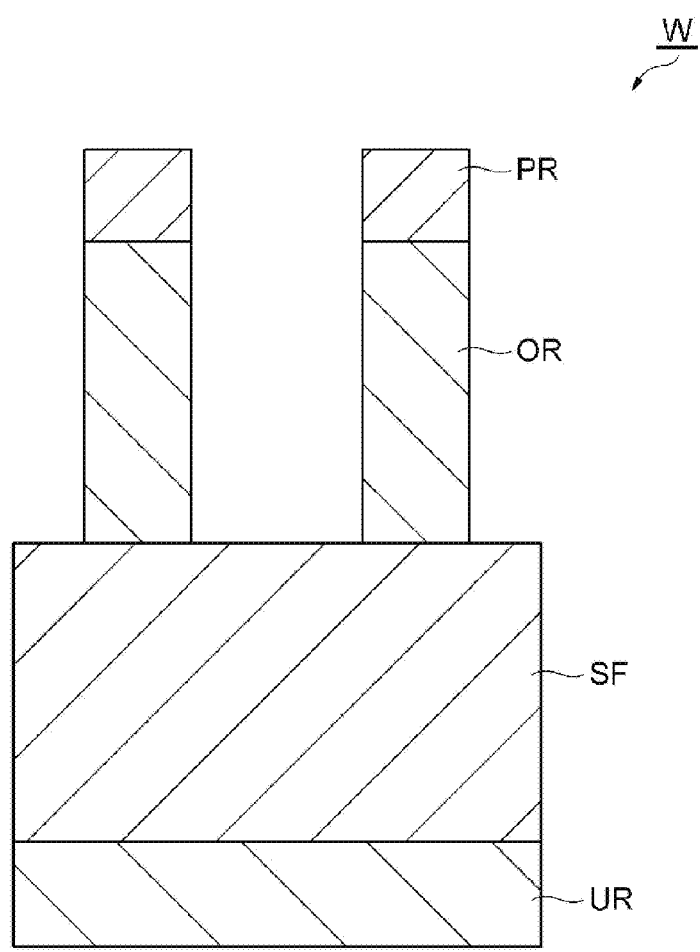
FIG. 5 is a partially enlarged cross-sectional view of the exemplary substrate after execution of step ST2 of the method shown in FIG. 1.

Referring back to FIG. 1, the method MT will be described in detail. In the following description, the case in which the method MT is performed by using the plasma processing apparatus 10 will be described as an example. Further, the following description will be described with reference to FIGS. 4 to 8. FIGS. 4, 6, 7, and 8 schematically show inner states of the chamber of the exemplary plasma processing apparatus during the execution of the method shown in FIG. 1. FIG. 5 is a partially enlarged cross-sectional view of the exemplary substrate after execution of step ST2 of the method shown in FIG. 1.

First, step ST1 of the method MT is executed. During the execution of step ST1, the substrate W is not mounted on the supporting table 16 and is not disposed in the chamber 11. During the execution of step ST1, the shutter SH may open or close the opening of the partition wall 14. In step ST1, as shown in FIG. 4, an organic film OF is formed. The organic film OF is formed on a surface extending out around a region WR. The region WR is a region in the chamber 11 where the substrate W is mounted. In one example, the region WR is disposed directly above the supporting table 16 (electrostatic chuck 20). In other words, the organic film OF is formed at least on a surface radially extending around the substrate W with respect to the center of the substrate W.

In the case of using the plasma processing apparatus 10, the organic film OF is formed on a surface that defines the first space S1. Specifically, the organic film OF is formed on a surface 14e of the partition wall 14, a surface 30e of the upper electrode 30, and a surface 32e of the member 32. The surface 14e defines the first space S1 in the entire surface of the partition wall 14. The surface 30e defines the first space S1 in the entire surface of the upper electrode 30, e.g., a bottom surface of the ceiling plate 34. The surface 32e defines the first space S1 in the entire surface of the member 32. The organic film OF may or may not be formed on a surface that defines the first space S1 in the entire surface of the focus ring FR. The organic film OF may or may not be formed on a surface that defines the first space S1 in the entire surface of the insulating member 28.

In step ST1 of one embodiment, the first gas and the second gas are alternately or simultaneously supplied to the first space S1 in order to form the organic film OF. The first gas and the second gas are also supplied to the second space S2 through the first space S1. One of the first gas and the second gas is supplied by the gas supply unit 40. The other one of the first gas and the second gas is supplied by the gas supply unit 42. In step ST1, the gas exhaust unit 52 is controlled to set a pressure in the inner space S to a specified pressure. In step ST1, plasma is not generated in the inner space S.

In the case where the first gas and the second gas are alternately supplied to the first space S1 in step ST1, the inner space S may be purged after the supply of the first gas and before the supply of the second gas. In the case where the first gas and the second gas are alternately supplied to the first space S1 in step ST1, the inner space S may be purged after the supply of the second gas and before the supply of the first gas. The inner space S is purged by exhausting the gas in the inner space S by the gas exhaust unit 52. When the inner space S is purged, an inert gas may be supplied from the gas supply unit 40 to the inner space S. The inert gas is, e.g., a rare gas or a nitrogen gas.

The first gas contains a first organic compound. The second gas contains a second organic compound. The organic film OF is formed by polymerization of the first organic compound and the second organic compound. The polymerization of the first organic compound and the second organic compound occurs at a temperature within a first temperature range of, e.g., 0° C. to 150° C. In other words, the polymerization of the first organic compound and the second organic compound does not occur at a temperature within a second temperature range which is lower than the lower limit of the first temperature range. Further, the polymerization of the first organic compound and the second organic compound does not occur at a temperature within a third temperature range of, e.g., 250° C. to 400° C., which is higher than the upper limit of the first temperature range. The organic compound formed by the polymerization of the first organic compound and the second organic compound may be depolymerized to the first organic compound and the second organic compound at a temperature within the third temperature range.

In step ST1 of one embodiment, one or more components having the aforementioned surfaces are heated to selectively form the organic film OF on those surfaces. Specifically, each of the components is heated to a temperature within the first temperature range by the heater provided therein. For example, the partition wall 14, the upper electrode 30, and the member 32 are heated by the respective heaters HT14, HT30, and HT32 to a temperature within the first temperature range. As a result, the organic film OF is formed on the surface 14e of the partition wall 14, the surface 32e of the member 32, and the surface 30e of the upper electrode 30. The organic film OF is also formed on a surface 14f that defines the second space S2 in the entire surface of the partition wall 14.

When the partition wall 14 and the insulating portion 28 are fastened to each other by means of, e.g., screws, a temperature of the insulating member 28 is also within the first temperature range. In this case, the organic film OF is also formed on the surface of the insulating member 28 in step ST1. When the focus ring FR is heated to a temperature within the first temperature range by the heater HTF, the organic film OF is also formed on the surface of the focus ring FR in step ST1.

During the execution of step ST1, the temperature of the supporting table 16 is set to a temperature within the second temperature range or the third temperature range. When the temperature of the supporting table 16 is set to the temperature within the second temperature range, the coolant is supplied to the flow path 18f. When the temperature of the supporting table 16 is set to the temperature within the third temperature range, the electrostatic chuck 20 is heated by the heater HT20. The contact area between the focus ring FR and each of the supporting table 16 (the electrostatic chuck 20) and the insulating member 28 is small. Therefore, the focus ring FR is thermally separated from the supporting table 16 and the insulating member 28. The contact area between the insulating member 28 and the supporting table 16 is also small. Therefore, the insulating portion 28 is thermally separated from the supporting table 16. Accordingly, the temperatures of the focus ring FR, the supporting table 16, and the insulating member 28 can be individually controlled.

Hereinafter, the description will be made on examples of the first organic compound, the second organic compound, and the organic compound produced by the polymerization of the first organic compound and the second organic compound, i.e., the organic compound forming the organic film OF.

The first organic compound may be isocyanate shown in the following formula (1) or (2). The second organic compound may be amine shown in the following formula (3) or (4). In other words, the first organic compound may be monofunctional isocyanate or difunctional isocyanate, and the second organic compound may be monofunctional amine or difunctional amine.

<Formula 1>

$$OCN-R \quad (1)$$

<Formula 2>

$$OCN-R-NCO \quad (2)$$

<Formula 3>

$$H_2N-R \quad (3)$$

<Formula 4>

$$H_2N-R-NH_2 \quad (4)$$

In the formulas (1) and (2), R represents a saturated hydrocarbon group such as an alkyl group (linear alkyl group or cyclic alkyl group) or the like, an unsaturated hydrocarbon group such as an aryl group or the like, or a group containing a heteroatom such as N, O, S, F, Si or the like. The group containing the heteroatom includes an unsaturated hydrocarbon group or a saturated hydrocarbon group whose elements are partially substituted with N, O, S, F, Si, or the like. As for the isocyanate that is the first organic compound, an aliphatic compound or an aromatic compound may be used, for example. As for the aliphatic compound, an aliphatic chain compound or an aliphatic cyclic compound may be used. The aliphatic compound may include, e.g., hexamethylene diisocyanate. The aliphatic cyclic compound may include, e.g., 1,3-bis (isocyanatomethyl) cyclohexane (H6XDI).

In the formulas (3) and (4), R represents a saturated hydrocarbon group such as an alkyl group (linear alkyl group or a cyclic alkyl group) or the like, an unsaturated hydrocarbon group such as an aryl group or the like, or a group containing a heteroatom such as N, O, S, F, Si or the like. The group containing the heteroatom includes an unsaturated hydrocarbon group or a saturated hydrocarbon group whose elements are partially substituted with N, O, S, F, Si, or the like. The atomic group represented by R in the formula (1) or (2) may be the same as or different from the atomic group represented by R in the formula (3) or (4). As for the amine that is the second organic compound, an aliphatic compound or an aromatic compound may be used, for example. As for the aliphatic compound, an aliphatic chain compound or an aliphatic cyclic compound may be used. The aliphatic compound may include, e.g., 1,12-diaminododecane (DAD). The aliphatic cyclic compound may include 1,3-bis (aminomethyl) cyclohexane (H6XDA). The amine that is the second organic compound may be secondary amine.

As for the organic compound obtained by polymerization of isocyanate and amine (addition condensation), compounds having a urea bond shown in the following formulas (5) to (8) may be used. The compound shown in the formula (5) is produced by polymerization of the compound shown in the formula (1) and the compound shown in the formula (3). The compound shown in the formula (6) is produced by polymerization of the compound shown in the formula (1) and the compound shown in the formula (4). Alternatively, the compound shown in the formula (6) is produced by polymerization of the compound shown in the formula (2) and the compound shown in the formula (3). The compound shown in the formula (7) is produced by polymerization of the compound shown in the formula (2) and the compound shown in the formula (4). The compound shown in the formula (8) has a structure in which both ends of the polymer shown in the formula (7) are terminated with a monomer having an isocyanate group (e.g., the compound shown in the formula (1)) and a monomer having an amino group (e.g., the compound shown in the formula (3)). In the formulas (7) and (8), n is an integer of 2 or more.

<Formula 5>

(5)

<Formula 6>

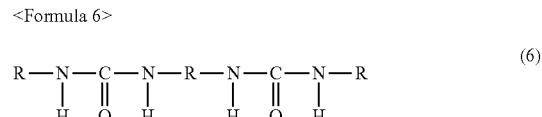

(6)

<Formula 7>

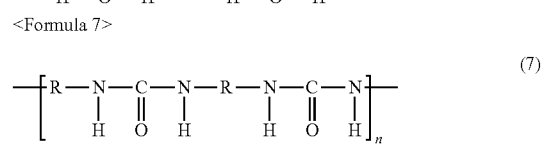

(7)

<Formula 8>

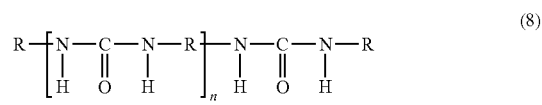

(8)

In another example, the first organic compound may be isocyanate shown in the formula (1) or (2), and the second organic compound may be a compound having a hydroxyl group shown in the following formula (9) or (10). In other words, the first organic compound may be monofunctional isocyanate or difunctional isocyanate, and the second organic compound may be a monofunctional compound having a hydroxyl group or a difunctional compound having a hydroxyl group.

<Formula 9>

 (9)

<Formula 10>

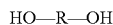 (10)

In the formulas (9) and (10), R represents a saturated hydrocarbon group such as an alkyl group (linear alkyl group or cyclic alkyl group) or the like, an unsaturated hydrocarbon group such as an aryl group or the like, or a group containing a heteroatom such as N, O, S, F, Si or the like. The group containing the heteroatom includes an unsaturated hydrocarbon group or a saturated hydrocarbon group whose elements are partially substituted with N, O, S, F, Si, or the like. The atomic group represented by R in the formulas (1) and (2) may be the same as or different from the atomic group represented by R in the formulas (9) and (10). The compound having a hydroxyl group is alcohol or phenol. As for the alcohol that is the second organic compound, ethylene glycol can be used, for example. As for the phenol that is the second organic compound, hydroquinone can be used, for example.

As for another organic compound obtained by polymerization (poly addition) of isocyanate and a compound having a hydroxyl group, compounds having a urethane bond shown in the following formulas (11) to (15) can be used. The compound shown in the formula (11) is produced by polymerization of the compound shown in the formula (1) and the compound shown in the formula (9). The compound shown in the formula (12) is produced by polymerization of the compound shown in the formula (1) and the compound shown in the formula (10). The compound shown in the formula (13) is produced by polymerization of the compound shown in the formula (2) and the compound shown in the formula (9). The compound shown in the formula (14) is produced by polymerization of the compound shown in the formula (2) and the compound shown in the formula (10). The compound shown in the formula (15) has a structure in which both ends of the polymer shown in the formula (14) are terminated with a monomer having an isocyanate group (e.g., the compound shown in the formula (1)) and a monomer having a hydroxyl group (e.g., the compound shown in the formula (9)). In the formulas (14) and (15), n is an integer of 2 or more.

<Formula 11>

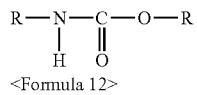 (11)

<Formula 12>

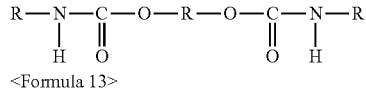 (12)

<Formula 13>

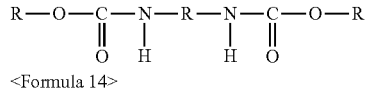 (13)

<Formula 14>

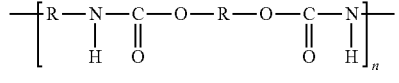 (14)

<Formula 15>

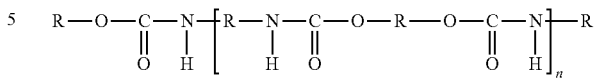 (15)

In still another example, the first organic compound may be carboxylic acid shown in the following formula (16) or (17), and the second organic compound may be amine shown in the formula (3) or (4). In other words, the first organic compound can be monofunctional carboxylic acid or difunctional carboxylic acid, and the second organic compound can be monofunctional amine or difunctional amine.

<Formula 16>

 (16)

<Formula 17>]

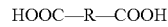 (17)

In the formulas (16) and (17), R represents a saturated hydrocarbon group such as an alkyl group (a linear alkyl group or a cyclic alkyl group) or the like, an unsaturated hydrocarbon group such as an aryl group or the like, or a group containing a heteroatom such as N, O, S, F, or Si or the like. The group containing the heteroatom includes an unsaturated hydrocarbon group or a saturated hydrocarbon group whose elements are partially substituted with N, O, S, F, Si, or the like. The atomic group represented by R in the formulas (3) and (4) may be the same as or different from the atomic group represented by R in the formulas (16) and (17). The carboxylic acid that is the first organic compound may be, e.g., terephthalic acid.

As for the organic compound obtained by polymerization (poly condensation) of carboxyl acid and amine, compounds having an amide bond shown in the following formulas (18) to (22), e.g., polyamide can be used. The compound shown in the formula (18) is produced by polymerization of the compound shown in the formula (16) and the compound shown in the formula (3). The compound shown in the formula (19) is produced by polymerization of the compound shown in the formula (16) and the compound shown in the formula (4). The compound shown in the formula (20) is produced by polymerization of the compound shown in the formula (17) and the compound shown in the formula (3). The compound shown in the formula (21) is produced by polymerization of the compound shown in the formula (17) and the compound shown in the formula (4). The compound shown in the formula (22) has a structure in which both ends of the polymer shown in the formula (21) are terminated with a monomer having a carboxyl group (e.g., the compound shown in the formula (16)) and a monomer having an amino group (e.g., the compound shown in the formula (3)). In the formulas (21) and (22), n is an integer of 2 or more. The polymerization reaction of carboxylic acid and amine produces water molecules. The produced water molecules are exhausted from the processing space under a depressurized environment. Therefore, the polymerization reaction of carboxylic acid and amine is irreversible.

<Formula 18>

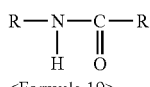
(18)

<Formula 19>

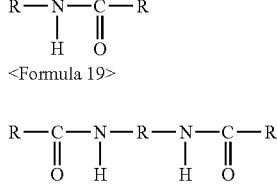
(19)

<Formula 20>

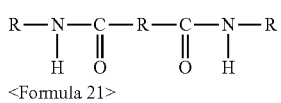
(20)

<Formula 21>

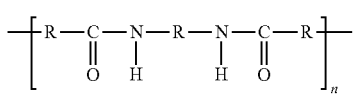
(21)

<Formula 22>

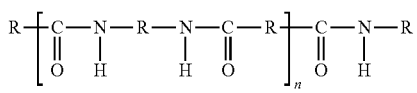
(22)

The first organic compound used for polymerization with the amine shown in the formula (3) or (4) may be carboxylic acid halide shown in the following formula (23). In the formula (23), X is F, Cl, Br, or I. The atomic group represented by R in the formula (23) may be the same as or different from the atomic group represented by R in the formulas (16) and (17).

<Formula 23>

(23)

In still another example, the first organic compound may be carboxylic acid shown in the formula (16) or (17), and the second organic compound may be a compound having a hydroxyl group shown in the formula (9) or (10). In other words, the first organic compound may be monofunctional carboxylic acid or difunctional carboxylic acid, and the second organic compound may be a monofunctional compound having a hydroxyl group or a difunctional compound having a hydroxyl group. The atomic group represented by R in formulas (16) and (17) may be the same as or different from the atomic group represented by R in formulas (9) and (10).

As for the organic compound obtained by polymerization (poly condensation) of carboxylic acid and a compound having a hydroxyl group, a compound having an ester bond shown in the following formulas (24) to (28), e.g., polyester, can be used. The compound shown in the formula (24) is produced by polymerization of the compound shown in the formula (16) and the compound shown in the formula (9). The compound shown in the formula (25) is produced by polymerization of the compound shown in the formula (16) and the compound shown in the formula (10). The compound shown in the formula (26) is produced by polymerization of the compound shown in the formula (17) and the compound shown in the formula (9). The compound shown in the formula (27) is produced by polymerization of the compound shown in the formula (17) and the compound shown in the formula (10). The compound shown in the formula (28) has a structure in which both ends of the polymer shown in the formula (27) are terminated with a monomer having a carboxyl group (e.g., the compound shown in the formula (16)) and a monomer having a hydroxyl group (e.g., the compound shown in the formula (9)). In the formulas (27) and (28), n is an integer of 2 or more. The polymerization reaction of the carboxylic acid and the compound having the hydroxyl group produces water molecules. The produced water molecules are exhausted from the processing space under a depressurized environment. Therefore, the polymerization reaction of the carboxylic acid and the compound having the hydroxyl group is irreversible.

<Formula 24>

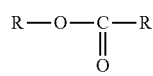
(24)

<Formula 25>

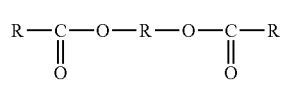
(25)

<Formula 26>

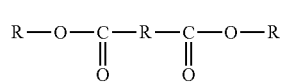
(26)

<Formula 27>

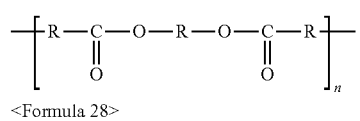
(27)

<Formula 28>

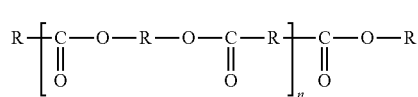
(28)

The first organic compound used for polymerization with the compound having the hydroxyl group shown in the formula (9) or (10) may be carboxylic acid halide shown in the formula (23).

In still another example, the first organic compound may be carboxylic acid anhydride shown in the following formula (29) or (30), and the second organic compound may be amine shown in the formula (3) or (4).

<Formula 29>

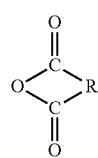
(29)

<Formula 30>

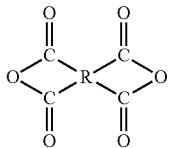
(30)

In the formulas (29) and (30), R represents a saturated hydrocarbon group such as an alkyl group (linear alkyl group or cyclic alkyl group) or the like, an unsaturated hydrocarbon group such as an aryl group or the like, or a group containing a heteroatom such as N, O, S, F, Si or the like. The group containing the heteroatom includes an unsaturated hydrocarbon group or a saturated hydrocarbon group whose elements are partially substituted with N, O, S, F, Si, or the like. The atomic group represented by R in formulas (29) and (30) may be the same as or different from the atomic group represented by R in formulas (3) and (4). The carboxylic acid anhydride that is the first organic compound may be, e.g., pyromellitic dianhydride.

The organic compound obtained by polymerization of carboxylic acid anhydride and amine may be, e.g., an imide compound shown in the following formula (31) or formula (32). The compound shown in the formula (31) is produced by polymerization of the compound shown in the formula (29) and the compound shown in the formula (3). The compound shown in the formula (32) is produced by polymerization of the compound shown in the formula (30) and the compound shown in the formula (4). In the formulas (31) and (32), n is an integer of 2 or more. The polymerization reaction of carboxylic anhydride and amine produces water molecules. The produced water molecules are exhausted from the processing space under a depressurized environment. Therefore, the polymerization reaction of carboxylic acid anhydride and amine is irreversible. In the polymerization of carboxylic anhydride and amine, monofunctional carboxylic anhydride, difunctional carboxylic anhydride, monofunctional amine, and difunctional amine may be used.

<Formula 31>

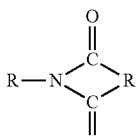
(31)

<Formula 32>

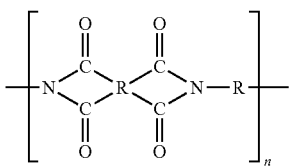
(32)

In the method MT, subsequent to step ST1, the substrate W is loaded into the chamber 11 and mounted on the supporting table 16. The substrate W is held by the electrostatic chuck 20.

Next, in the method MT, step ST2 is executed. During the execution of step ST2, the shutter SH closes the opening of the partition wall 14. In step ST2, the organic region OR of the substrate W is etched. The organic region OR is etched by chemical species from the plasma in the chamber 11 (in the first space S1).

In step ST2, the processing gas is supplied to the inner space S (the first space S1). The processing gas may contain any gas as long as the organic region OR can be etched. The processing gas may contain an oxygen-containing gas. The oxygen-containing gas may be an oxygen gas ($O_2$ gas), a CO gas, or a $CO_2$ gas. Alternatively, the processing gas may be a gaseous mixture of a hydrogen gas ($H_2$ gas) and a nitrogen gas ($N_2$ gas). In step ST2, the gas exhaust unit 52 is controlled to set a pressure in the inner space S to a specified pressure. Further, in step ST2, the first high frequency power is supplied to generate plasma of the processing gas. The second high frequency power may be supplied or may not be supplied.

In step ST2, the plasma of the processing gas is generated in the inner space S (the first space S1). In step ST2, the organic region OR is etched by chemical species from the plasma of the processing gas as shown in FIG. 5. The chemical species from the plasma may mainly contain radicals. The chemical species from the plasma may contain ions as well as radicals. The chemical species from the plasma are consumed not only by the etching of the organic film OF as well as the plasma etching of the organic region OR of the substrate W. The organic film OF is formed on the surface extending out around the region WR where the substrate W is disposed. Therefore, the variation in the amount of consumption of the chemical species depending on positions in the chamber 11 is suppressed. As a result, the variation in the density of the chemical species depending on positions on the substrate W is also suppressed. Accordingly, according to the method MT, high in-plane uniformity is obtained in the plasma etching of the organic region OR.

Figure 6:
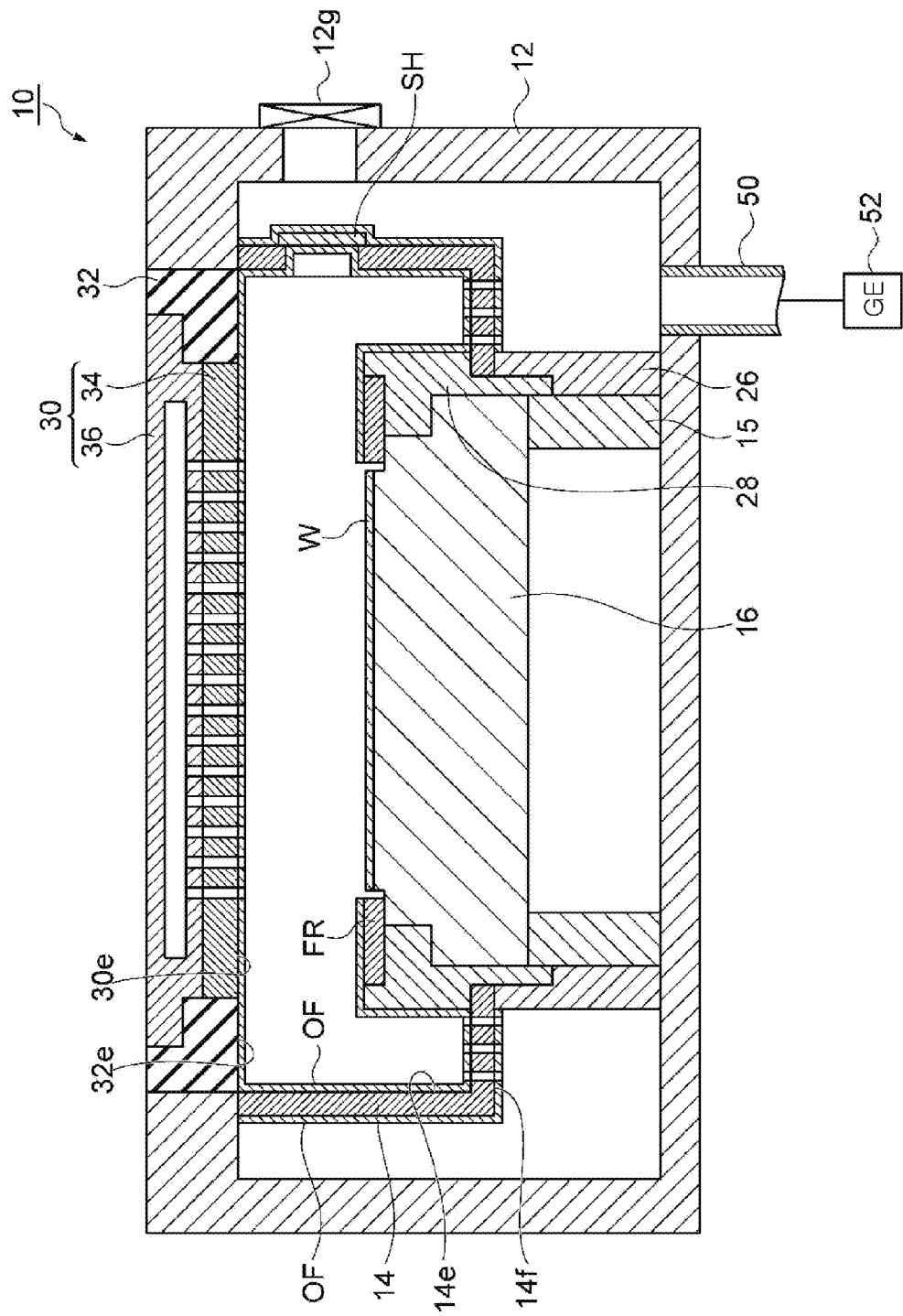
FIGS. 6 to 8 schematically show inner states of the chamber of the exemplary plasma processing apparatus during the execution of the method shown in FIG. 1.

In one embodiment, a sequence including steps ST1 and ST2 may be repeated. The sequence may be repeated to etch the organic regions OR of a plurality of substrates. After the execution of step ST2, the organic film OF may remain on the aforementioned surfaces as shown in FIG. 6. In one embodiment, the organic film OF on the surfaces that define the first space S1 are removed before the next sequence is executed. Therefore, the method MT may include step ST3 as shown in FIG. 1. In other words, the sequence may include step ST3 in addition to steps ST1 and ST2.

Figure 7:
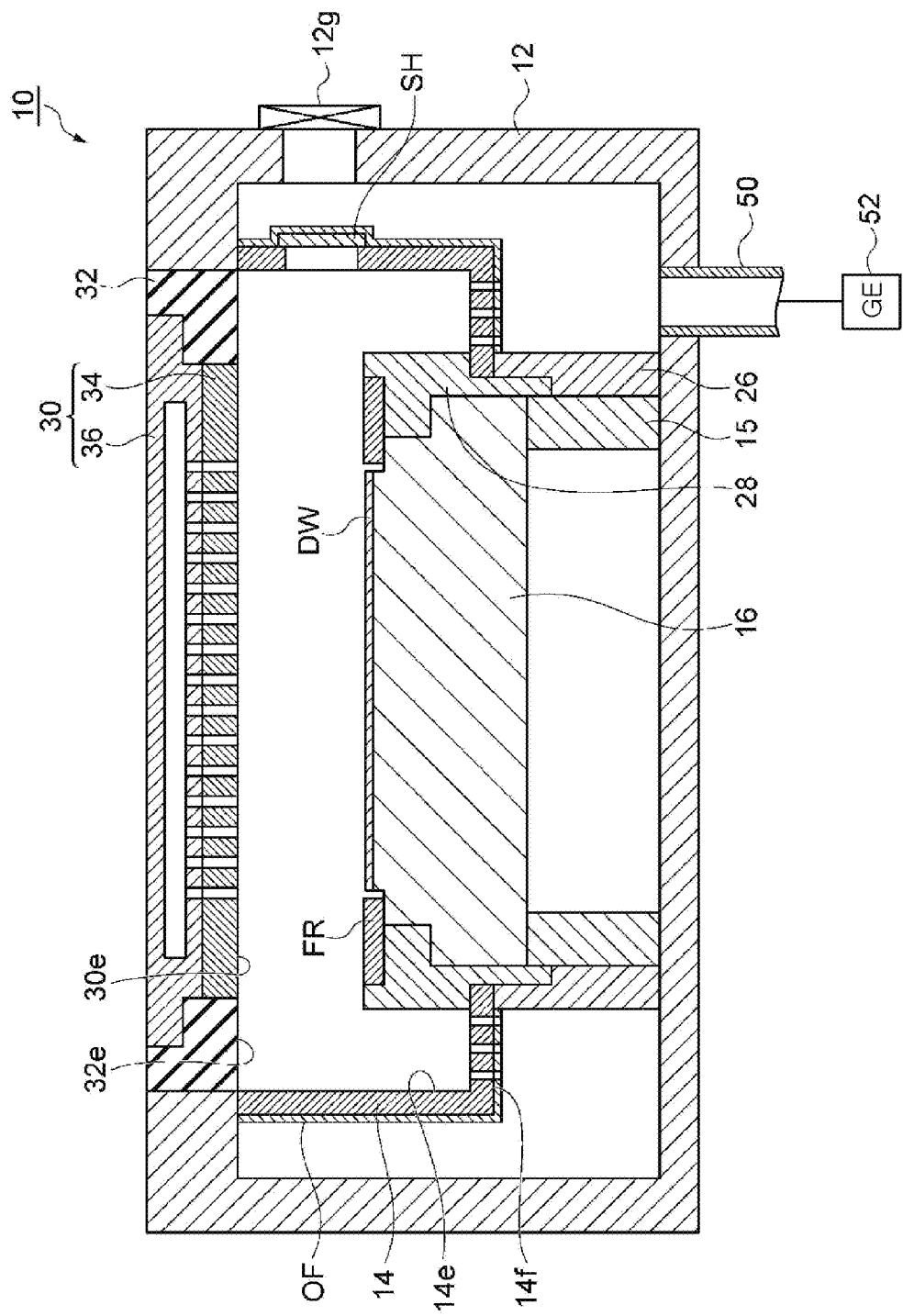

In step ST3 of one embodiment, the organic film OF is removed by plasma cleaning. Specifically, a cleaning gas is supplied to the inner space S (the first space S1). The cleaning gas may contain any gas as long as it can remove the organic film OF. The cleaning gas may contain oxygen-containing gas. The oxygen-containing gas may be an oxygen gas ($O_2$ gas), a CO gas, or a $CO_2$ gas. Alternatively, the cleaning gas may be a gaseous mixture of a hydrogen gas ($H_2$ gas) and a nitrogen gas ($N_2$ gas). In step ST3, the gas exhaust unit 52 is controlled to set a pressure in the inner space S to a specified pressure. Further, in step ST3, the first high frequency power is supplied to generate plasma of the cleaning gas. The second high frequency power may be supplied or may not be supplied. During the execution of step ST3, the shutter SH closes the opening of the partition wall 14. In step ST3 of the present embodiment, the organic film OF is removed from the surfaces that define the first space S1 by active species from the plasma of the cleaning gas, as shown in FIG. 7. Since the active species from the plasma hardly reach the second space S2, the organic film OF remains on the surface that defines the second space S2. Further, during the execution of step ST3 of the present embodiment, a dummy substrate DW may be mounted on the supporting table 16 (electrostatic chuck 20). Alternatively, during the execution of step ST3 of the present embodiment, an object may not be mounted on the supporting table 16 (electrostatic chuck 20).

Figure 8:
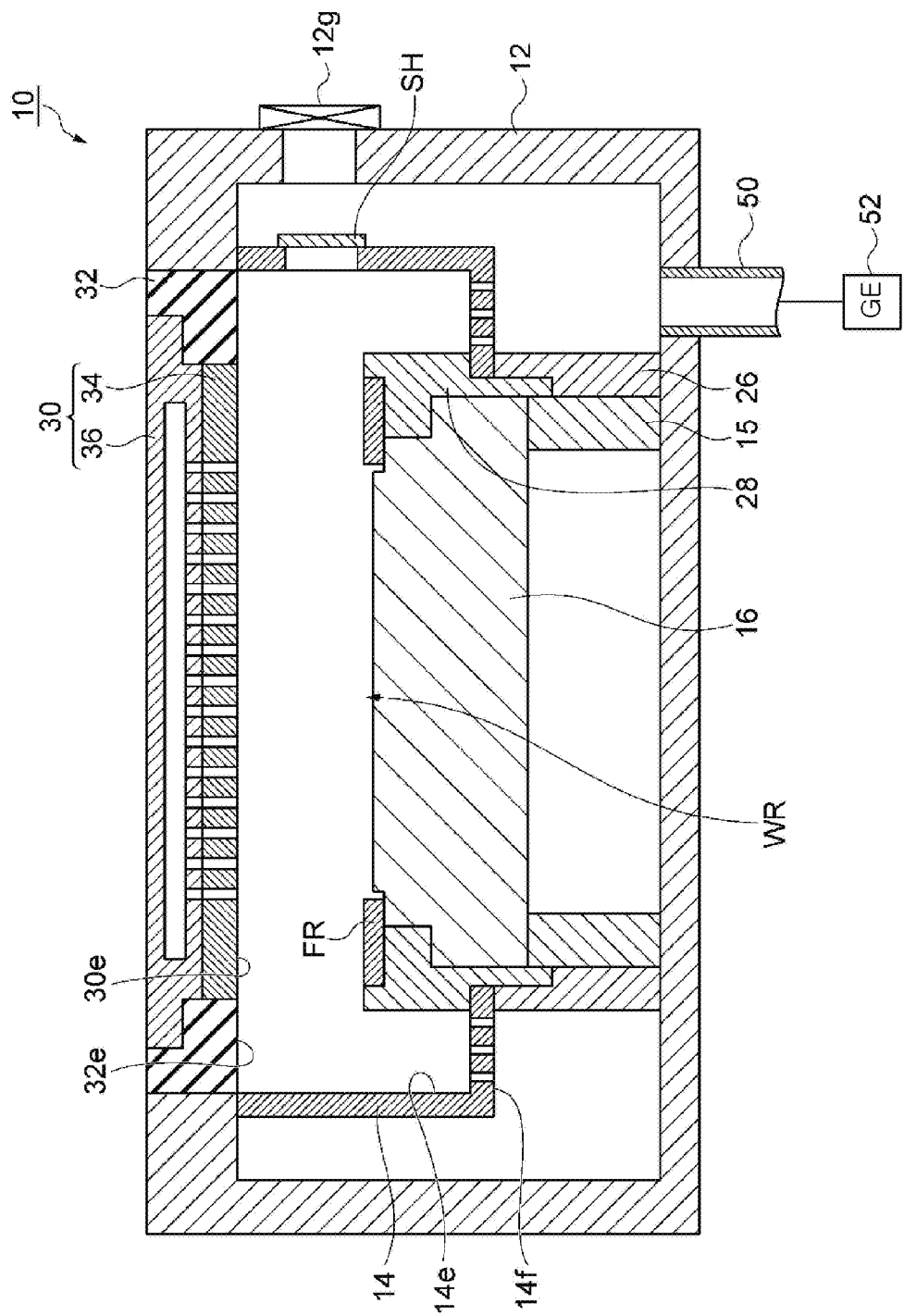

In another embodiment, step ST3 may be applied to the case in which the organic film OF is made of an organic compound produced by polymerization of isocyanate and amine or an organic compound produced by polymerization of isocyanate and a compound having a hydroxyl group. In step ST3 of this embodiment, one or more components on which the organic film OF is formed are heated to a temperature within the third temperature range. During the execution of step ST3, the shutter SH closes the opening of the partition wall 14. In step ST3 of this embodiment, the partition wall 14, the upper electrode 30, and the member 32 are heated to a temperature within the third temperature range by the heaters HT14, HT30, and HT32, respectively. When the organic film OF is also formed on the focus ring FR, the focus ring FR is heated to a temperature within the third temperature range by the heater HTF. As a result, depolymerization of the organic compound forming the organic film OF occurs. The gas of the organic compound due to depolymerization is exhausted. Accordingly, the organic film OF is removed from the surfaces that define the inner space S as shown in FIG. 8.

Next, in step ST4, it is determined whether or not a termination condition for the method MT is satisfied. The termination condition is determined to be satisfied when the number of executions of the sequence including steps ST1 and ST2 has reached a predetermined number. If it is determined in step ST4 that the termination condition is not satisfied, the sequence including steps ST1 and ST2 is executed again. On the other hand, if it is determined in step ST4 that the termination conditions are satisfied, the execution of the method MT is terminated.

While various embodiments have been described, various modifications can be made without being limited to the above-described embodiments. For example, the method MT may be performed by using a plasma processing apparatus other than the plasma processing apparatus 10. Such a plasma processing apparatus may be an inductively coupled plasma processing apparatus, or a plasma processing apparatus for generating plasma by a surface wave such as a microwave.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A method for etching an organic region of a substrate, comprising:
   forming an organic film on a surface in a chamber of a plasma processing apparatus, the surface extending out around a region where the substrate is to be disposed in the chamber of the plasma processing apparatus; and
   etching the organic region with chemical species from plasma in the chamber,
   wherein in said forming the organic film, a first gas containing a first organic compound and a second gas containing a second organic compound are supplied into the chamber, and
   the organic film is formed by polymerization of the first organic compound and the second organic compound.

2. The method of claim 1, wherein a heater is provided in each of one or more components that define the surface in the plasma processing apparatus, and
   in said forming the organic film, the components are heated such that the polymerization occurs selectively on the surface.

3. The method of claim 2, wherein a sequence including said forming the organic film and said etching the organic region repeated, and
   the method further comprises, between said etching the organic region and said forming the organic film, removing the organic film by plasma cleaning.

4. The method of claim 2, wherein a sequence including said forming the organic film and said etching the organic region is repeated, and
   the method further comprises, between said etching the organic region and said forming the organic film, removing the organic film by depolymerization of the organic film.

5. The method of claim 4, wherein the first organic compound is isocyanate and the second organic compound is amine or a compound having a hydroxyl group.

6. The method of claim 1, wherein a sequence including said forming the organic film and said etching the organic region is repeated, and
   the method further comprises, between said etching the organic region and said forming the organic film, removing the organic film by plasma cleaning.

7. The method of claim 1, wherein a sequence including said forming the organic film and said etching the organic region is repeated, and
   the method further comprises, between said etching the organic region and said forming the organic film, removing the organic film by depolymerization of the organic film.

8. The method of claim 7, wherein the first organic compound is isocyanate and the second organic compound is amine or a compound having a hydroxyl group.

9. The method of claim 1, wherein
   the chamber has an inner space which includes a first space and a second space, with the first space and the second space being divided by a partition wall, and
   in said forming the organic film, the organic film is formed on a surface which defines the first space.

10. The method of claim 1,
    wherein the chamber includes a chamber body, with the chamber body having an inner space which includes a first space and a second space and with the first space and the second space being divided by a partition wall,
    the plasma processing apparatus includes an upper electrode and a member, with the upper electrode blocking an upper opening of the chamber body in cooperation with the member, and
    in said forming the organic film, the organic film is formed on a surface of the partition wall, a surface of the upper electrode and a surface of the member.

11. The method of claim 10,
    wherein the partition wall includes an opening through which the substrate is transferred between the first space and an outside of the chamber and a shutter which opens and closes the opening of the partition wall, and the forming of organic film is performed while the shutter opens the opening of the partition wall.

12. The method of claim 1, wherein, in said forming the organic film, the surface extending out around the region where the substrate is to be disposed is heated to a temperature within a first temperature range and the region where the substrate is to be disposed is set to a temperature within a second temperature range or a third temperature range, and
wherein the second temperature range is lower than a lower limit of the first temperature range and the third temperature range is higher than an upper limit of the first temperature range.

13. The method of claim 12, wherein the first temperature range is from 0° C. to 150° C. and the third temperature range is from 250° C. to 400° C.

14. The method of claim 1, wherein the first organic compound is isocyanate or carboxylic acid and the second organic compound is amine or a compound having a hydroxyl group.

15. The method of claim 1,
wherein said forming the organic film is performed while the substrate is not disposed in the chamber, and the method further comprises, between said forming the organic film and said etching the organic region, loading the substrate into the chamber.

16. The method of claim 1, wherein the first gas and the second gas are supplied into the chamber simultaneously.

17. The method of claim 1, wherein the first gas and the second gas are suppliedinto the chamber alternately.

18. The method of claim 17, wherein the chamber is purged after the supply of the first gas and before the supply of the second gas or after the supply of the second gas and before the supply of the first gas.

19. The method of claim 1, wherein, in said etching the organic region, the plasma is generated from an oxygen-containing gas or a gaseous mixture of a hydrogen gas and a nitrogen gas.

* * * * *